(12) United States Patent
Kato (10) Patent No.: US 10,164,162 B2
(45) Date of Patent: Dec. 25, 2018

(54) LIGHT EMITTING DEVICE, PACKAGE FOR LIGHT EMITTING DEVICE, AND METHOD FOR MANUFACTURING LIGHT EMITTING DEVICE

(71) Applicant: NICHIA CORPORATION, Anan-shi, Tokushima (JP)

(72) Inventor: Yasuo Kato, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/721,377

(22) Filed: Sep. 29, 2017

(65) Prior Publication Data

US 2018/0097162 A1  Apr. 5, 2018

(30) Foreign Application Priority Data

Sep. 30, 2016  (JP) .................................. 2016-192944

(51) Int. Cl.
```
H01L 33/60        (2010.01)
H01L 33/00        (2010.01)
H01L 33/50        (2010.01)
H01L 33/62        (2010.01)
```
(52) U.S. Cl.
CPC .......... *H01L 33/60* (2013.01); *H01L 33/0095* (2013.01); *H01L 33/502* (2013.01); *H01L 33/62* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 5,272,111 A | 12/1993 | Kosaki | |
| 2008/0006911 A1 | 1/2008 | Nakahara et al. | |
| 2014/0159064 A1* | 6/2014 | Sakariya | H01L 25/0753 257/88 |
| 2016/0064846 A1 | 3/2016 | Tadokoro | |

FOREIGN PATENT DOCUMENTS

| | | |
|---|---|---|
| JP | S53-139173 A | 12/1978 |
| JP | H04-249326 A | 9/1992 |
| JP | H05-78882 A | 3/1993 |
| JP | 4367457 B2 | 11/2009 |
| JP | 2010-176863 A | 8/2010 |
| JP | 2010-202900 A | 9/2010 |
| JP | 2013-204102 A | 10/2013 |
| JP | 2013-236005 A | 11/2013 |
| JP | 2015-030892 A | 2/2015 |
| WO | WO-2010/005088 A1 | 1/2010 |
| WO | WO-2014/178259 A1 | 11/2014 |

\* cited by examiner

*Primary Examiner* — Cheung Lee
(74) *Attorney, Agent, or Firm* — Foley & Lardner LLP (57) ABSTRACT

A light emitting device includes: a light emitting element; and a light reflective member adapted to reflect light emitted from the light emitting element, the light reflective member comprising a base metal made of a crystallized metal, an amorphous layer located over the base metal and made of an amorphous metal, and an Ag-containing layer located over the amorphous layer.

15 Claims, 8 Drawing Sheets

| | Amorphous layer or Ni alloy layer | Content of P of amorphous layer (% by weight) | Thickness of Pd layer | Thickness of Au layer | Ag-containing layer | Brightness of light reflective material | Total luminous fluxes of light emitting devices (lm) | Relative ratio of total luminous flux (%) |
|---|---|---|---|---|---|---|---|---|
| Example 1 | Electrolytic plating of NiP alloy, Thickness of 2 μm | 14 | 0.07 μm | 0.004 μm | Ag, Thickness of 0.5 μm | 1.95 | 8.45 | 100.0 |
| Example 2 | Electrolytic plating of NiP alloy, Thickness of 2 μm | 14 | 0.03 μm | 0.003 μm | Ag, Thickness of 2.0 μm | 1.98 | 8.48 | 100.4 |
| Comparative Example 1 | Electroless plating of Ni, Thickness of 0.5 μm | No amorphous layer | 0.03 μm | 0.005 μm | Ag, Thickness of 0.5 μm | 1.51 | 8.37 | 99.0 |
| Comparative Example 2 | Electrolytic plating of Ni, Thickness of 2 μm | No amorphous layer | 0.03 μm | 0.005 μm | Ag, Thickness of 2.0 μm | 1.96 | 8.45 | 100.0 |

| | Amorphous layer or Ni alloy layer | Content of P of amorphous layer (% by weight) | Thickness of Pd layer | Thickness of Au layer | Ag-containing layer | Brightness of light reflective material | Total luminous fluxes of light emitting devices (lm) | Relative ratio of total luminous flux (%) |
|---|---|---|---|---|---|---|---|---|
| Example 3 | Electrolytic plating of NiP alloy, Thickness of 2 μm | 14 | 0.03 μm | 0.005 μm | Ag, Thickness of 0.05 μm | 1.95 | 8.45 | 100.0 |
| Example 4 | Electrolytic plating of NiP alloy, Thickness of 2 μm | 14 | 0.03 μm | 0.005 μm | Ag, Thickness of 1.0 μm | 1.98 | 8.45 | 100.0 |
| Example 5 | Electroless plating of NiP alloy, Thickness of 1 μm | 14 | 0.01 μm | 0.003 μm | Ag, Thickness of 0.5 μm | 1.98 | 8.45 | 100.0 |
| Example 6 | Electrolytic plating of NiP alloy, Thickness of 0.5 μm | 12 | 0.08 μm | 0.01 μm | Ag, Thickness of 0.3 μm | 1.98 | 8.45 | 100.0 |
| Example 7 | Electrolytic plating of NiP alloy, Thickness of 0.5 μm | 14 | None | 0.1 μm | Ag, Thickness of 0.5 μm | 1.98 | 8.45 | 100.0 |
| Example 8 | Electrolytic plating of NiP alloy, Thickness of 0.5 μm | 14 | 0.03 μm | None | Ag, Thickness of 0.3 μm | 1.98 | 8.45 | 100.0 |
| Example 9 | Electrolytic plating of NiP alloy, Thickness of 2 μm | 14 | 0.03 μm | 0.005 μm | AgPd (1%) alloy, Thickness of 1.0 μm | 1.98 | 8.45 | 100.0 |
| Example 10 | Electrolytic NiP plating, Thickness of 2 μm | 14 | 0.03 μm | 0.005 μm | AgPd (1%) alloy, Thickness of 1.0 μm | 1.98 | 8.45 | 100.0 |
| Example 11 | Electrolytic NiS plating, Thickness of 1 μm | S = 19 | 0.01 μm | 0.003 μm | Ag, Thickness of 0.5 μm | 1.98 | 8.45 | 100.0 |
| Example 12 | Electroless NiB plating, Thickness of 1 μm | B = 6 | None | 0.2 μm | Ag, Thickness of 0.5 μm | 1.98 | 8.45 | 100.0 |
| Example 13 | Electrolytic NiWP plating, Thickness of 1 μm | W = 5, P = 5 | 0.01 μm | 0.008 μm | Ag, Thickness of 0.5 μm | 1.98 | 8.45 | 100.0 |
| Comparative Example 3 | Electrolytic Ni plating, Thickness of 2 μm | No amorphous layer | 0.03 μm | 0.005 μm | 0.05 μm | 1.09 | 8.20 | 97.0 |

LIGHT EMITTING DEVICE, PACKAGE FOR LIGHT EMITTING DEVICE, AND METHOD FOR MANUFACTURING LIGHT EMITTING DEVICE

CROSS-REFERENCE TO RELATED APPLICATION

The present application claims priority under 35 U. S. C. § 119 to Japanese Patent Application No. 2016-192944, filed Sep. 30, 2016, the contents of which are hereby incorporated herein by reference in their entirety.

BACKGROUND OF THE INVENTION

The present disclosure relates to a light emitting device that includes a light reflective member having an Ag-containing layer and to a method for manufacturing a light emitting device.

A large number of light emitting devices that use semiconductor light emitting elements (also simply hereinafter referred to as "light emitting elements") adopt packages that include, on their surfaces, silver (Ag), which has a high reflectance for light emitted from the light emitting elements (for example, JP 4367457 B1 and JP 2013-236005 A).

SUMMARY OF THE INVENTION

Ag has a high optical reflectance and is suitable as material for a light reflective member in the light emitting device, but is very expensive. If the Ag layer is formed to be thin (with a thickness of, e.g., 1 µm or less) to reduce the cost by decreasing the amount of Ag, however, there arises a problem that the optical reflectance of the light emitting device is reduced as shown in a comparative example of FIG. 8.

A light emitting device according to one embodiment of the present invention includes a light emitting element and a light reflective member that reflects light emitted from the light emitting element, the light reflective member including a base metal made of a crystallized metal, an amorphous layer provided over the base metal and made of an amorphous metal, and an Ag-containing layer provided over the amorphous layer.

A method for manufacturing a light emitting device according to one embodiment of the present invention includes the steps of: preparing a light reflective member; preparing a package including the light reflective member; and mounting a light emitting element in the package, in which the step of preparing the light reflective member includes preparing a base metal, forming an amorphous layer made of an amorphous metal on the base metal by plating, and forming an Ag-containing layer on the amorphous layer by plating.

With this configuration, a light emitting device with excellent light extraction efficiency can be provided.

DETAILED DESCRIPTION

Embodiments of the present invention will be described below with reference to the accompanying drawings. The following embodiments are only to illustrate a light emitting device and a method for manufacturing a light emitting device for exemplifying the technical idea of the present invention, and the present invention is not limited thereto. The size, material, shape, relative arrangement, etc., of each component mentioned in the embodiments are not intended to limit the scope of the present invention only thereto, unless otherwise specified, and are illustrative only. Furthermore, the size, positional relationship, and the like of members shown in some drawings are emphasized to clarify the description.

First Embodiment

A light emitting device according to a first embodiment includes:

(a) a light emitting element; and
(b) a light reflective member 1 that reflects light emitted from the light emitting element, the light reflective member including a base metal made of a crystallized metal, an amorphous layer provided over the base metal and made of an amorphous metal, and an Ag-containing layer provided over the amorphous layer.

The light reflective member 1 is a member that can reflect light emitted from a light emitting element 2. The light reflective member 1 may be applied to the light emitting device in any form that utilizes its reflective function. For example, the light reflective member may be provided under the light emitting element 2 and configured to reflect light emitted downward from the light emitting element. Alternatively, the light reflective member may be used as a reflector by being configured to enclose the light emitting element. More specifically, for example, as mentioned later in a third embodiment, the light reflective member 1 can be in the form of plate, as a lead frame. Alternatively, the light reflective member 1 maybe used as a wiring formed on an insulating base body. The light reflective member 1 may also have a function as a heat dissipation member that dissipates heat, in addition to a function as a mounting member that mounts the light emitting element and a function as a conductive member that is electrically connected to the light emitting element. To take into account these functions other than the reflective function, various modifications maybe made to the light reflective member 1 in order to obtain high heat dissipation, high conductivity, and adequate wire bonding. Consequently, the modified light reflective member 1 can also be applied to the light emitting device.

The light reflective member 1 in the first embodiment will be described in detail below.

Figure 1:
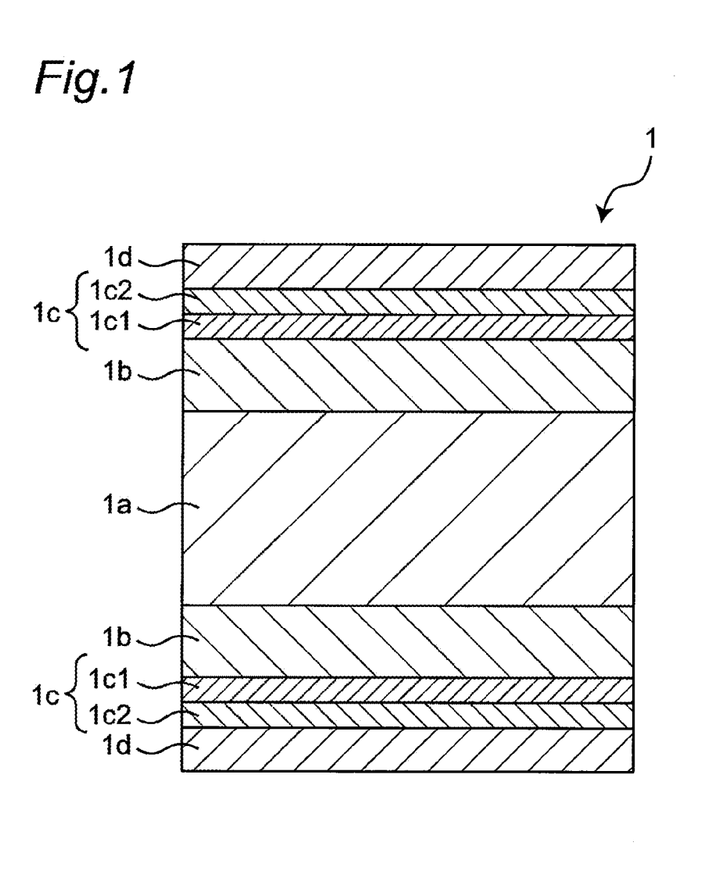
FIG. 1 is a schematic enlarged cross-sectional view for explaining a structure of a light reflective member in a light emitting device according to a first embodiment.

For example, as shown in the cross-sectional view of FIG. 1, the light reflective member 1 in this embodiment includes a base metal 1a made of a Cu alloy, an amorphous layer 1b provided over the base metal 1a and made of NiP, a first underlayer 1c1 made of a Pd layer and a second underlayer 1c2 made of a Au layer, which underlayers are provided over the amorphous layer 1b, and an Ag-containing layer 1d provided over the underlayers. The thickness of the Ag-containing layer 1d is, for example, in a range of approximately 0.05 µm to approximately 1.0 µm.

The light reflective member 1 in the light emitting device with the above-mentioned structure according to this embodiment can achieve the high optical reflectance even when the Ag-containing layer 1d is made thinner than that in the related art. Thus, the light emitting device can have the high light extraction efficiency. The reasons for this are as follows. In general, a metal layer, such as an Ag-containing layer, provided by plating on the base metal or underlayer, has its characteristics influenced by the crystal structure of the plating on the base metal or underlayer. That is, when the base metal or underlayer has a crystal structure, the metal layer formed thereon is influenced by its crystal structure and undergoes the so-called epitaxial growth. The inventors have found that the crystal structure derived from the base metal or the like adversely affects the optical reflectance of the Ag-containing layer, especially, the Ag-containing layer having a thickness of 1 µm or less. This finding leads to the embodiment of the present invention. The light reflective member 1 in this embodiment includes the amorphous layer 1b disposed between the base metal 1a and the Ag-containing layer 1d. The amorphous layer 1b can reduce the influence of the crystal structure of the base metal or the like. Provision of the amorphous layer 1b can reduce or eliminate the influence of the crystal structure of the base metal 1a on the Ag-containing layer 1d provided over the base metal 1a by plating. Thus, it is possible to form the Ag-containing layer 1d exhibiting a high optical reflectance and having a dense, fine crystal structure derived from Ag with few defects. Accordingly, the light reflective member 1 with a high optical reflectance can be obtained even when the thickness of the Ag-containing layer 1d is thinned, which can achieve the light emitting device with the high light extraction efficiency.

<Light Reflective Member 1>

The light reflective member 1 is a member that reflects light emitted from the light emitting element. The light reflective member 1 has the Ag-containing layer 1d as a surface layer and is provided in the light emitting device so as to reflect the light emitted from the light emitting element or a wavelength-conversion member to be mentioned later.

As shown in FIG. 1, in the light reflective member 1 of this embodiment, the amorphous layer 1b, the first underlayer 1c1, the second underlayer 1c2, and the Ag-containing layer 1d are provided in this order over the base metal 1a of the light reflective member 1. For example, with the base metal 1a centered on respective sides of the upper surface, the bottom surface, and the side surface of the light reflective member, the amorphous layer 1b, the first underlayer 1c1, the second underlayer 1c2, and the Ag-containing layer 1d are provided in this order.

<Ag-Containing Layer 1d>

The Ag-containing layer 1d is provided as the outermost layer of the light reflective member 1. The thickness of the Ag-containing layer 1d is, preferably, in a range of approximately 0.05 µm to approximately 1.0 µm. When the thickness of the Ag-containing layer 1d is less than 0.05 µm, the optical reflectance thereof is reduced. When the thickness of the Ag-containing layer 1d is more than 1.0 µm, the material cost thereof is increased. In terms of the material cost and the reliability of assembly, such as the wire bonding property, and also in terms of preventing sulfurization, the thickness of the Ag-containing layer 1d is preferably set at approximately 0.1 µm to approximately 0.5 µm. To suppress the material cost while increasing the optical reflectance, the thickness of the Ag-containing layer 1d is, preferably, in a range of approximately 0.2 µm to approximately 0.5 µm. To prevent the diffusion of material from the underlayers 1c1 and 1c2, the thickness of the Ag-containing layer 1d is preferably set at 0.5 µm to 1.0 µm.

The surface of the light reflective member 1 has an optical reflectance of the light in a wavelength range of visible light of 70% or more, and more preferably 80% or more. In this way, the light extraction efficiency of the light emitting device can be improved. The light reflective member 1 preferably has high brightness. The brightness thereof is 0.5 or more, more preferably 1.0 or more, and even more preferably 1.6 or more. The brightness as used herein is a numerical value measured by using a micro surface color difference meter VSR 300A (trade name), manufactured by NIPPON DENSHOKU CO., LTD., under conditions of an illumination angle of 45° and vertical light receiving.

Examples of a material for the Ag-containing layer 1d include an elemental Ag, and Ag alloys, such as alloys of Ag and Au, Pt, Rh, Pd, Os, Ru, Sn, In, Zn, Te, and the like. For the Ag alloy, the proportion of silver in the whole alloy is preferably in a range of approximately 70% to 99%.

The Ag-containing layer 1d does not need to be provided over the entire surface of the light reflective member 1. That is, at least a part of the surface of the light reflective member 1 only need to be formed of the Ag-containing layer 1d. For example, the Ag-containing layer 1d may not be exposed at the bottom surface of a concave part 13r of a package 13 shown in FIGS. 2A and 2B to be mentioned later. That is, the Ag-containing layer 1d may not be provided on surfaces of an embedded part, an external terminal part, and a mounting part of the light reflective member 1. Here, the embedded part is a part embedded in an inside of a side-wall part 31 of a resin molded body 3. The external terminal part is a part exposed at an outer part of the resin molded body 3. The mounting part is a part exposed on a side of the bottom surface of the light emitting device. To provide the Ag-containing layer 1d in a part of the light reflective member 1 in this way, the Ag-containing layer can be provided by covering and protecting a part, in which the Ag-containing layer 1d is not to be formed, with a resist, a protective tape, or the like as a mask during a deposition process.

The Ag-containing layer 1d may be provided at both the upper surface and a bottom surface opposite the upper surface of the light reflective member 1, like this embodiment. Alternatively, the Ag-containing layer 1d may be provided only at one surface without being provided on other surfaces. Alternatively, the Ag-containing layer 1d may be provided at only a part of one surface. The Ag-containing layers 1d may have a uniform thickness or different thicknesses over the entire regions where the Ag-containing layers are provided. By the Ag-containing layer 1d having different thicknesses, the cost of the light emitting device can be reduced more effectively. For example, the Ag-containing layer 1d may be provided at the upper surface and the bottom surface of the light reflective member 1. Further, the thickness of the Ag-containing layer 1d formed at one of the upper and bottom surfaces may be larger than the thickness of the Ag-containing layer 1d formed at the other. In view of improving the light extraction efficiency, the thick Ag-containing layer 1d is preferably provided at the upper surface where the light emitting element 2 is mounted or at an area in the vicinity of the light emitting element 2. Thus, the amount of material, such as Ag, can be decreased to thereby reduce the cost.

<Base Metal 1a>

The light reflective member 1 includes the base metal 1a with the Ag-containing layer 1d and the like laminated thereon.

In this embodiment, the base metal 1a serves as a main body that has substantially the same shape as the shape of the light reflective member 1.

Materials suitable for use in the base metal 1a include Cu, Fe, alloys of these elements, and a clad metal (e.g., lamination of Cu/FeNi/Cu). Cu and its alloys are preferably used because of their good heat dissipation. In particular, plate-shaped Cu and Cu alloys are preferable because they are good in terms of mechanical properties, electrical properties, workability, and the like. The cladding material is preferable because the cladding material can reduce a linear expansion coefficient to a lower level, thus enhancing the reliability of the light emitting device 100.

The metal forming the base metal 1a is crystallized metal. Although metal and alloys are generally crystallized, to distinguish from an amorphous state, the term crystallized metal is used herein. That is, "crystallized metal" means metal other than amorphous metal and includes a polycrystalline metal (an aggregate of crystal grains). The base metal 1a made of such a metal occasionally has defects in the crystal structure due to a heat treatment or the like, for example, heating during forming by rolling. If the Ag-containing layer 1d is formed by plating on the base metal having the crystal structure with such defects, the Ag-containing layer 1d might grow while inheriting the feature of the crystal structure containing the defects. Thus, defects would be caused in the crystals of the Ag-containing layer 1d, resulting in reduction in the optical reflectance. However, the amorphous layer 1b is provided between the base metal 1a and the Ag-containing layer 1d as mentioned above, thereby making it possible to solve such problems.

The thickness, shape, and the like of the base metal 1a can be variously selected in accordance with the shape or the like of the light emitting device 100. The base metal 1a can have, for example, a plate shape, an ingot form, a film shape, or the like. Furthermore, the base metal 1a may be a wiring pattern provided by printing or the like on a ceramic or the like, and additionally, Cu or its alloy may be plated on the formed wiring pattern.

<Amorphous Layer 1b>

The light reflective member 1 in this embodiment has the amorphous layer 1b between the base metal 1a made of crystallized metal (base metal 1a of a crystalline substance) and the Ag-containing layer 1d.

The thickness of the amorphous layer 1b is preferably, for example, in a range of approximately 0.05 μm to approximately 10 μm, and more preferably in a range of approximately 0.05 μm to approximately 5 μm. By setting the thickness of the amorphous layer 1b at approximately 0.05 μm or more, the diffusion of the material of the base metal 1a into Ag-containing layer can be effectively reduced. By setting the thickness of the amorphous layer 1b at approximately 10 μm or less and preferably approximately 5 μm or less, the raw material cost and the manufacturing cost can be reduced.

As the material for the amorphous layer 1b, for example, NiP, NiS, NiB, and a NiWP alloy can be used. Among them, a NiP alloy, which enables easy manufacturing of the amorphous layer, is preferably used. By setting the P content in the NiP alloy at 11% by weight or more, the amorphous NiP alloy can be made. The proportion of P in the amorphous layer 1b is preferably set at a level of, for example, approximately 11% by weight to approximately 25% by weight, and more preferably approximately 12% by weight to approximately 15% by weight. This is because, as the P content is increased, the amorphous layer tends to become brittle, and the light reflective member 1 is more difficult to process.

<Underlayer 1c>

An underlayer 1c, made of a different material from the materials of the Ag-containing layer 1d and the amorphous layer 1b, can be provided between the Ag-containing layer 1d and the amorphous layer 1b for various purposes as appropriate. In this embodiment, the first underlayer 1c1 and the second underlayer 1c2 are provided as the underlayer 1c.

The underlayer 1c (second underlayer 1c2) provided directly under the Ag-containing layer 1d is preferably formed using metal that has high adhesion to Ag and is less likely to react with sulfur components, compared with Ag. Specifically, Au and a Au alloy are preferable as the material for the underlayer, and in particular, Au is more preferable.

As material for the underlayer 1c (first underlayer 1c1) provided directly above the amorphous layer 1b, for example, Pd, a Pd alloy, and the like are preferable.

When the material containing Cu is used to form the base metal 1a, preferably, the amorphous layer 1b as a NiP alloy is provided on the base metal 1a, and the first underlayer 1c1 made of Pd and the second underlayer 1c2 made of Au are laminated on the amorphous layer in this order. This arrangement can enhance the adhesion of the Ag-containing layer 1d and enhance wire bonding, while suppressing the diffusion of Cu of the base metal 1a into the Ag-containing layer 1d.

The underlayer 1c may be a layer that serves to prevent both the sulfurization and the diffusion. Thus, the cost can be reduced. For example, Au can be preferably used because Au is less likely to react with a sulfur component and additionally exhibits a high degree of effectiveness of preventing the diffusion.

The above-mentioned amorphous layer 1b, Ag-containing layer 1d, underlayer 1c, and the like are formed by plating. When the light reflective member 1 has the base metal 1a, a pretreatment is preferably performed on the base metal 1a before the plating. Examples of the pretreatment include acid treatments using dilute sulfuric acid, dilute nitric acid, dilute hydrochloric acid, etc., and alkali treatments using sodium hydroxide, etc. The same treatment or a combination of different treatments can be repeatedly performed once or several times. When the pretreatment is performed several times, washing is preferably carried out with running pure water after each pretreatment. When the base metal $1a$ is a metal plate made of Cu or an alloy containing Cu, dilute sulfuric acid is preferably used. When the base metal $1a$ is a metal plate made of Fe or an alloy containing Fe, dilute hydrochloric acid is preferably used.

When the material of the amorphous layer $1b$ is a NiP alloy, the amorphous layer $1b$ can be formed using a NiP plating solution.

As a plating method, electrolytic plating or electroless plating can be used. Among them, the electrolytic plating is preferable because the plating speed for layer formation is high so that productivity can be enhanced.

When forming the Ag-containing layer $1d$ by electrolytic plating, a gloss agent, such as a Se-based gloss agent, a Sb-based gloss agent, a S-based gloss agent, and an organic gloss agent, is used together with raw material of the Ag-containing layer, so that the brightness of the Ag-containing layer can be improved. When using a large amount of the gloss agent, the components of such a gloss agent are taken into the Ag-containing layer $1d$, which causes the deterioration of the corrosion resistance. Meanwhile, in this embodiment, before plating of the Ag-containing layer $1d$, the underlayer $1c$ is formed, and the film quality of the underlayer $1c$ is controlled so that the brightness of the resulting Ag-containing layer can be set in a high-level range even when the amount of the gloss agent is set small. Thus, the light reflective member 1 with a high brightness and excellent corrosion resistance can be obtained.

To increase the optical reflectance of the light reflective member 1, the flatness of the base metal $1a$ is preferably set to be high. Specifically, for example, a surface roughness Ra of the light reflective member 1 is preferably set at 0.5 µm or less. Consequently, the flatness of the underlayer $1c$ and the Ag-containing layer $1d$, provided over the base metal $1a$, can be enhanced. Because of this, even when the thickness of the Ag-containing layer $1d$ that reflects the light is relatively thin, for example, 0.1 µm to 0.5 µm, the optical reflectance of the light reflective member 1 can be effectively increased. The flatness of the base metal $1a$ can be enhanced by a process, such as a rolling process, physical polishing, chemical polishing, or the like.

Figure 3A:
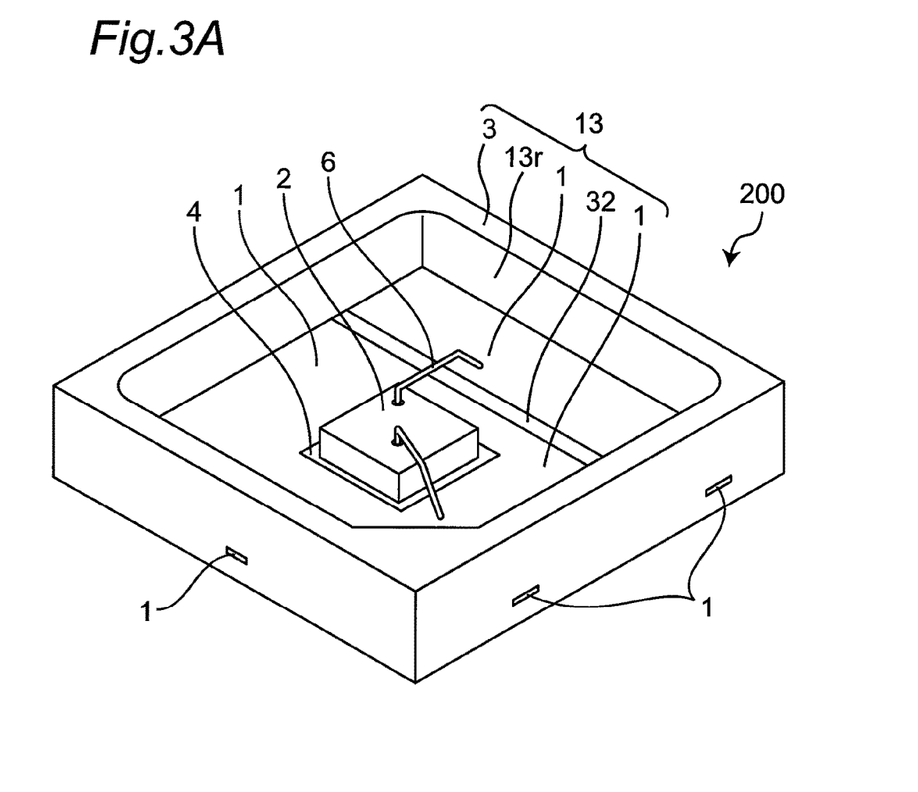
FIG. 3A is a schematic perspective view for explaining a light emitting device according to a fourth embodiment.
Figure 3B:
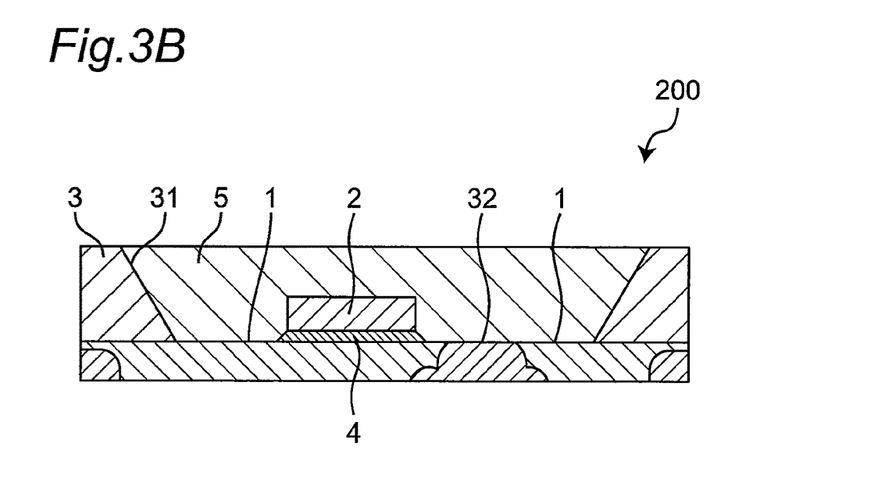
FIG. 3B is a schematic cross-sectional view for explaining the light emitting device according to the fourth embodiment.

As shown in FIGS. 3A and 3B to be mentioned later, each light reflective member 1 preferably has, for example, a substantially flat-plate shape and has no bent part. The amorphous layer $1b$ is more brittle than a normal metal layer in many cases. When bending the light reflective member 1 including the amorphous layer $1b$, the Ag-containing layer $1d$ might be broken, or cracks might occur in the Ag-containing layer $1d$. Thus, oxidization, sulfurization, or the like might occur in the base metal of the light reflective member 1, thereby degrading the reliability of the light emitting device 100. However, when the light reflective member 1 having a substantially flat-plate shape with no bent part is used in the light emitting device 100, it is possible to reduce degradation of the reliability of the light emitting device 100.

Second Embodiment

While the first embodiment is related to the light emitting device including the light reflective member 1, a second embodiment will focus on a package for the light emitting device.

A package for a light emitting device according to the second embodiment includes:
(a) a light reflective member 1 that reflects light emitted from the light emitting element, the light reflective member 1 including a base metal made of a crystallized metal, an amorphous layer provided over the base metal and made of an amorphous metal, and an Ag-containing layer provided over the amorphous layer; and
(b) a base body supporting the light reflective member 1.

Some specific examples are below.

For example, in a first example according to the second embodiment, a package for a light emitting device includes the base body and the light reflective member 1 provided over the base body so as to enclose a region where the light emitting element is mounted. In the package for the light emitting device of the first example, the light reflective member 1 is a reflector.

In a second example according to the second embodiment, a package for the light emitting device includes a resin molded body as the base body and a pair of lead frames made of the plate-shaped light reflective members 1 embedded in the resin molded body, as mentioned later in a third embodiment. The package for the light emitting device in the second example can also be configured using a molded body that is made of inorganic material, such as ceramic or glass, instead of the resin molded body.

In a third example according to the second embodiment, a package for a light emitting device includes two plate-shaped light reflective members 1 positioned on the same plane, a resin separation part as a base body that supports the two plate-shaped light reflective members 1 while separating the light reflective members from each other, and a resin frame provided so that the surface of the two plate-shaped light reflective members 1 and the resin separation part to be exposed on the inner side of the resin frame, as mentioned later in the fourth embodiment.

As mentioned above, various configurations of the light emitting device can be provided, each including the light reflective member 1 and the base substrate supporting the light reflective member 1.

The light emitting element is mounted in the above-mentioned package for a light emitting device according to the second embodiment, thereby making it possible to manufacture the light emitting device in the first embodiment.

For example, a method for manufacturing a light emitting device includes the steps of:
preparing the light reflective member 1;
preparing the package including the light reflective member 1; and
mounting a light emitting element in the package.

The step of preparing the light reflective member 1 includes preparing the base metal, forming the amorphous layer made of amorphous metal on the base metal by plating, and forming the Ag-containing layer on the amorphous layer by plating.

Third Embodiment

Figure 2A:
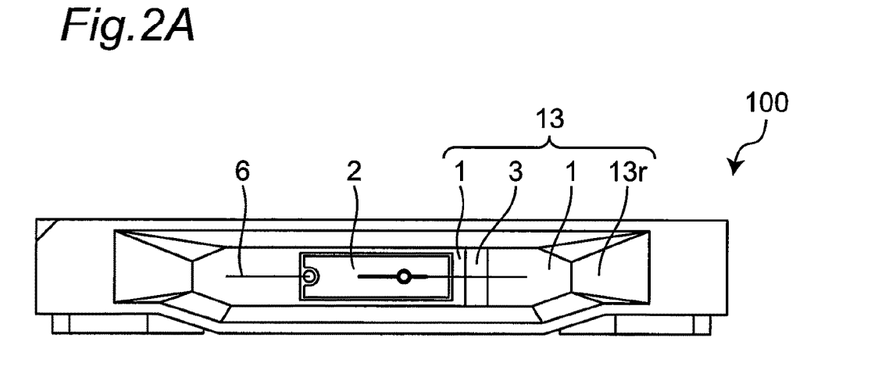
FIG. 2A is a schematic plan view for explaining a light emitting device according to a third embodiment.
Figure 2B:
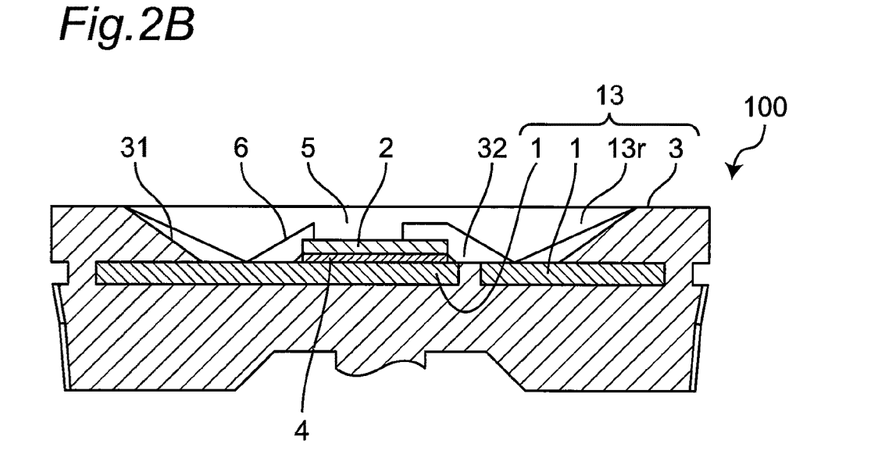
FIG. 2B is a schematic cross-sectional view for explaining the light emitting device according to the third embodiment.

FIGS. 2A and 2B show the structure of a light emitting device 100 according to a third embodiment.

The light emitting device 100 in this embodiment includes a light emitting element 2 having a rectangular shape in the planar view, a pair of plate-shaped light reflective members 1 having the Ag-containing layer on their surfaces, and the resin molded body 3 in which parts of the light reflective members 1 are embedded. In the light emitting device 100 of the third embodiment, the light reflective members 1, configured in the same manner as that in the first embodiment, are used as a lead frame, whereby the package 13 is configured to include the light reflective members 1 and the resin molded body 3. The resin molded body 3 in this embodiment has a horizontally elongated shape in the planar view and is molded to have a horizontally elongated concave part (a concave part 13r of the package 13) formed on its side surface. The respective pair of light reflective members 1 serving as the lead frames is exposed at the bottom surface of the concave part 13r of the package 13.

In the light emitting device 100 of this embodiment, as shown in FIG. 2A, except for the region that separates the pair of light reflective members 1 configuring positive and negative lead frames (surface of the resin molded body 3 positioned between the pair of light reflective members 1), the bottom surface of the concave part 13r of the package 13 is defined by the surfaces of the light reflective members 1. Consequently, the reflectance of light from the bottom surface of the concave part 13r can be increased. Parts of the pair of light reflective members 1 are respectively drawn from the outer surfaces of the resin molded body 3 and bent along the lower surface of the molded body 3. The parts of the light reflective members 1 bent along the lower surface of the resin molded body 3 serve as external terminal parts.

In the light emitting device 100 of this embodiment, the light emitting element 2 is mounted on one of the pair of light reflective members 1 exposed at the bottom surface of the concave part 13r of the package 13. Positive and negative electrodes of the light emitting element 2 are respectively connected to one light reflective member 1 and the other light reflective member 1 by wires 6. A seal member 5 is provided in the concave part 13r of the package 13 to cover the light emitting element 2 and the wires 6. The seal member 5 is made of a translucent resin containing a phosphor, which is excited by light emitted from the light emitting element 2 and emits light with a wavelength different from that of the light emitting element 2

In the light emitting device 100 with the above-mentioned structure according to the third embodiment, the positive and negative lead frames are configured as the pair of light reflective members 1, thereby increasing the reflectance of the light from the bottom surface of the concave part 13r of the package 13, so that the light extraction efficiency of the light emitting device can be enhanced.

Further, in the light emitting device according to the third embodiment, the Ag-containing layer 1d in the light reflective member 1 can be thinned. Thus, the light emitting device can be provided at low cost.

The components of the light emitting device 100 in the third embodiment will be described.

<Light Emitting Element 2>

The light emitting element 2 is provided in a position that allows the light emitted from the light emitting element 2 to be reflected by the light reflective member 1. In the third embodiment, the light emitting element 2 is provided within the concave part 13r of the package 13 that exposes the light reflective member 1 at the bottom surface of the concave part.

A semiconductor light emitting element that emits light at an arbitrary wavelength can be selected as the light emitting element 2. For example, the light emitting element 2 that emits blue or green light can use a nitride-based semiconductor, such as InGaN, GaN, and AlGaN, or GaP. A red light emitting element can use GaAlAs, AlInGaP, etc. Moreover, the light emitting element 2 can also use material other than the materials mentioned above. The composition, emission color, size, and the number of the light emitting elements 2 in use can be selected as appropriate in accordance with the purpose.

When the light emitting device 100 includes a wavelength-conversion member, the light emitting element suitably uses a nitride semiconductor capable of emitting light with a short wavelength that can efficiently excite the wavelength-conversion member. Various emission wavelengths can be selected depending on the material of the semiconductor layer and a mixed crystal ratio thereof. The light emitting element 2 can be one that outputs ultraviolet rays or infrared rays, in addition to the light in the visible light range.

The light emitting element 2 is preferably mounted on the light reflective member 1. In this way, the light extraction efficiency of the light emitting device 100 can be improved.

The light emitting element 2 has positive and negative electrodes electrically connected to conductive members. These positive and negative electrodes may be provided on a side of one surface of the light emitting element 2, like the light emitting device in the third embodiment, or alternatively may be respectively provided on both upper and lower surfaces of the light emitting element 2. The connection of the electrodes with the light reflective members 1 as the lead frames may be performed by the wires 6 as shown in FIGS. 2A and 2B. In this case, for example, the electrode is bonded to one light reflective member 1 via a bonding member 4 to be mentioned later in the fourth embodiment. The connection of the electrode with the light reflective member 1 may be performed by flip-chip mounting.

Like the light emitting device in the third embodiment, mounting of the light emitting element 2 over the Ag-containing layer 1d of the light reflective member 1 can improve the light extraction efficiency of the light emitting device.

To feed power to the light emitting element 2, in addition to the use of the wire 6, the above-mentioned bonding member 4 can also be used as a conductive member to be bonded to the electrode of the light emitting element 2. Furthermore, a plurality of light emitting elements 2 can be used to configure the light emitting device. In such a case, for example, the plurality of light emitting elements 2 can also be connected together by the wires 6 such that these light emitting elements 2 are linked to each other. Alternatively, each light emitting element 2 may be connected to a corresponding lead without connecting the plurality of light emitting elements 2 together. <Resin Molded Body>

The light emitting device 100 in the third embodiment includes the resin molded body 3 as a base body for supporting or holding the light reflective members 1. In the light emitting device 100 of the third embodiment, the package is configured to include the light reflective members 1 and the resin molded body 3. The resin molded body 3 is a member that is mainly made of resin and integrally holds the pair of light reflective members 1. The shape of the resin molded body 3 in the planar view can be a quadrilateral shape, a polygonal shape, or a combination thereof, in addition to the horizontally elongated outer appearance shown in FIGS. 2A and 2B. When the package 13 of the light emitting device 100 has the concave part 13r, like the third embodiment, a side wall part 31 of the resin molded body 3 located around the concave part 13r may have its inner side surface formed with an inclination angle relative to the bottom surface as shown in FIG. 2B or may have its inner side surface formed at a substantially right angle relative to the bottom surface of the concave part. The inner side surface of the side wall part 31 in the concave part may be a stepped surface with a stepped part. The height of the concave part, the shape of an opening in the concave part, and the like can be selected as appropriate in accordance with the purpose and application. The light reflective member 1 is preferably provided within the concave part. Like the third embodiment, the light reflective member may be provided at the side wall part 31 thereof, in addition to the bottom surface part 32 thereof.

The base material suitable for use in the resin molded body 3 is thermosetting resin or thermoplastic resin. In particular, the thermosetting resin is preferably used. The thermosetting resin is preferably a resin that is less permeable to gas, compared to resin used in the seal member 5. Specifically, examples of the thermosetting resin can include epoxy resin compositions, silicone resin compositions, modified epoxy resin compositions, such as silicone modified epoxy resins, modified silicone resin compositions, such as epoxy modified silicone resins, polyimide resin compositions, modified polyimide resin compositions, urethane resins, and modified urethane resin compositions. Fine particles, made of $TiO_2$, $SiO_2$, $Al_2O_3$, $MgO$, $MgCO_3$, $CaCO_3$, $Mg(OH)_2$, $Ca(OH)_2$, etc., are mixed as a filling material (filler) into such a base material of the resin molded body 3, whereby the light transmittance of the light emitting device is preferably adjusted so as to reflect approximately 60% or more of the light emitted from the light emitting element, and more preferably approximately 90% thereof.

Note that the base body that supports or holds the light reflective member 1 is not limited to the resin molded body 3 of the third embodiment and may be formed of inorganic materials, such as ceramic, glass, and metals. This arrangement can provide the light emitting device with high reliability and that is less prone to degradation or the like.

<Bonding Member 4>

The bonding member 4 is a member for fixing the light emitting element 2 over one light reflective member 1. Preferable materials for the conductive bonding member 4 in use can include conductive pastes made of silver, gold, palladium, etc., eutectic solder materials made of Au—Sn, Sn—Ag—Cu, etc., brazing filler metals, such as low-melting-point metals, and bonding materials between the light emitting element and the light reflective member using particles of Cu, Ag, or Au, or a coating. Examples of the insulating bonding member 4 suitable for use include epoxy resin compositions, silicone resin compositions, polyimide resin compositions, modified resins thereof, and hybrid resins thereof. In the use of these resins, a metal layer with a high reflectance, such as an Al film or an Ag film, or a dielectric reflective film can be provided on the mounting surface of the light emitting element 2 by taking into account the degradation of the resin due to light or heat from the light emitting element 2.

<Seal Member 5>

The light emitting device 100 according to this embodiment may include the seal member 5. The seal member 5 is provided to cover members, including the light emitting element 2, the light reflective members 1, the wires 6, and a protective film, thereby making it possible to protect the covered members from dust, moisture, further an external force, and the like. Consequently, the reliability of the light emitting device 100 can be enhanced. In particular, after forming the protective film, the seal member 5 is provided over the protective film. Thus, the protective film can be protected, thus enhancing the reliability of the light emitting device, which is very preferable.

The seal member 5 preferably has the translucency that allows light emitted from the light emitting element 2 to pass therethrough and also has the light resistance that is less prone to degradation due to the light. Specific materials for the seal member can include insulating resin compositions with the translucency that allows light emitted from the light emitting element to pass therethrough. Examples of the insulating resin compositions include silicone resin compositions, modified silicone resin compositions, modified epoxy resin compositions, and fluororesin compositions. In particular, the material for the seal member 5 can also use a hybrid resin and the like that contains at least one of resins having a siloxane skeleton as a base, such as dimethyl silicone, phenyl silicone having a small phenyl content, and fluorinated silicone resins.

When the seal member 5 is made of resin, a potting (dripping) method, a compression molding method, printing method, transfer mold method, jet dispensing method, spray coating, etc., can be used as a method for forming the seal member 5. For the package 13 with the concave part as shown in FIGS. 2A and 2B, the potting method is preferable. When using a flat plate-shaped substrate instead of the package 13, the compression molding method or transfer mold method is preferable.

As shown in FIG. 2B, the seal member 5 can be provided to fill the concave part of the resin molded body 3.

The shape of an outer surface of the seal member 5 can be variously selected in accordance with the light distribution characteristics and the like required for the light emitting device 100. For example, an upper surface of the seal member 5 is formed in a convex lens shape, a concave lens shape, a Fresnel lens shape, as a rough surface, or the like, thereby making it possible to adjust the directional characteristics and the light extraction efficiency of the light emitting device.

The seal member 5 can contain a colorant, a light diffusion agent, a light reflective member, various kinds of fillers, a wavelength-conversion member, and the like.

The wavelength-conversion member is made of material that converts the wavelength of the light emitted from the light emitting element 2. When the light emitted from the light emitting element 2 is blue light, material suitable for use in the wavelength-conversion member is an yttrium-aluminum-garnet based phosphor (hereinafter referred to as "YAG:Ce"), which is one kind of aluminum oxide-based phosphors. The YAG:Ce phosphor absorbs part of the bluish light from the light emitting element to emit yellowish light as a complementary color. Because of this, the use of the YAG:Ce phosphor can relatively easily form the light emitting device 100 with high output that emits a whitish mixed-colored light.

Wire 6

The wire 6 connects the light emitting element 2 to the conductive member, such as the light reflective member 1. Materials suitable for use in the wire 6 include Au, Al, Cu, etc., and an alloy thereof. Alternatively, the wire 6 can include a core and a coating layer provided on the surface of the core and made of a different material from that of the core. For example, the wire can be one that includes a core made of Cu and a coating layer made of Pd, a PdAu alloy, etc., formed on the surface of the core. Among them, any one of Au, Ag, and an Ag alloy, which have high reliability, is preferably selected as the material for the wire. In particular, Ag or an Ag alloy, which has a high optical reflectance, is preferable. In this case, particularly, the wire 6 is preferably coated with the protective film. Thus, the protective film can prevent the sulfurization or break of the wire containing Ag, thereby enhancing the reliability of the light emitting device 100.

When the base metal 1a is made of Cu, and the wires 6 are made of Ag or an Ag alloy, the amorphous layer 1b formed between the base metal and the wires can prevent the formation of a local cell between Cu and Ag. Thus, the degradation in the light reflective member 1 or wire 6 might be reduced, thereby making it possible to produce the light emitting device 100 with the high reliability.

Protective Film

The light emitting device 100 may further include a protective film. This protective film is a member that covers at least the Ag-containing layer 1d provided at the surface of the light reflective member 1, thereby preventing the color change or corrosion of, mainly, the Ag-containing layer 1d at the surface of the light reflective member 1. Furthermore, the protective film may also optionally cover the surface(s) of any, some, or all of members, other than the light reflective member 1, including the light emitting element 2, the bonding member 4, the wire 6, and the base body (resin molded body 3), or the surface of the light reflective member 1 where no Ag-containing layer 1d is provided.

In this embodiment, the protective film is preferably provided continuously not only at the surface of the Ag-containing layer 1d or the light reflective member 1, but also at the surfaces of the light emitting element 2, the bonding member 4, the wires 6, the resin molded body 3, and the like.

When the wire 6 is connected to the light reflective member, the protective film is also preferably provided on the surface of the wire 6. When the wire 6 is made of Ag or an Ag alloy, the protective film is preferably provided to cover the wires 6. Thus, the protective film can prevent the sulfurization or break of the wire containing Ag, thereby enhancing the reliability of the light emitting device 100.

The protective film in this embodiment is preferably formed by an Atomic Layer Deposition method (hereinafter referred to as an "ALD" method). The ALD method can deposit the protective film very uniformly, and the deposited protective film is dense, compared to protective films obtained by other deposition methods, so that the sulfurization of the Ag-containing layer 1d can be prevented very efficiently.

Examples of the material for the protective film include oxides, such as $Al_2O_3$, $SiO_2$, $TiO_2$, $ZrO_2$, $ZnO$, $Nb_2O_5$, $MgO$, $In_2O_3$, $Ta_2O_5$, $HfO_2$, $SeO$, $Y_2O_3$, and $SnO_2$, nitrides, such as AlN, TiN, and ZrN, and fluorides, such as $ZnF_2$ and $SrF_2$. These materials may be used alone or in combination. Alternatively, these materials may be laminated.

Note that cracks might be caused in the protective film around the light emitting element 2 depending on a difference in the coefficient of the thermal expansion between the bonding member 4 and the light reflective member 1, and the Ag-containing layer 1d in the vicinity of the light emitting element 2 might be subjected to sulfurization. However, like this embodiment, by setting the thickness of the Ag-containing layer 1d to be very small, specifically, in a range of 0.1 μm to 0.5 μm, the progress of the sulfurization is reduced, thereby making it possible to suppress the reduction in the optical reflectance of the light reflective member 1.

The light emitting device 100 can include various members, in addition to the above-mentioned members. For example, a Zener diode can be mounted as a protective element.

Fourth Embodiment

As shown in FIGS. 3A and 3B, a light emitting device 200 in a fourth embodiment includes the package 13 and the light emitting element 2. The package 13 includes flat plate-shaped light reflective members 1 with no bent part and the resin molded body 3. The light emitting element 2 is provided on the surface of one of a pair of the light reflective members 1 exposed at the bottom surface of the concave part 13r of the package 13.

In the fourth embodiment, as shown in FIGS. 3A and 3B, the pair of light reflective members 1 is respectively formed to have a substantially rectangular flat plate shape in the planar view. In the fourth embodiment, the light reflective members 1 serve as the mounting members that mount the light emitting element 2 thereon and as positive and negative conductive members that are electrically connected to the light emitting element via the two wires 6.

Such a light emitting device 200 can be manufactured in the following way.

In the method below, a plurality of light emitting devices 200 are fabricated in an aggregated state, and then divided into individual light emitting devices 200. Thus, the light emitting device 200 can be manufactured at low cost. In the description below, a region corresponding to the individual light emitting device 200 will be hereinafter referred to as a unit region 201.

Figure 4A:
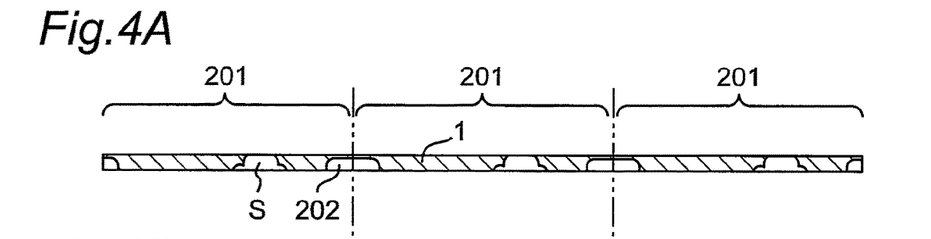
FIG. 4A is a schematic cross-sectional view for explaining a step in a method for manufacturing the light emitting device according to the fourth embodiment.

First, the light reflective member 1 shown in FIG. 4A is prepared. Specifically, a metal plate made of Cu as the base metal is punched to thereby form separation grooves S for separating the light reflective member 1 within each unit region 201 into the pair of light reflective members 1, as well as dividing slits 202 located between the adjacent unit regions 201 to divide the light reflective member 1 into individual light emitting devices 200. In this way, a lead frame base metal, which has a plurality of unit regions 201 including respective separation grooves S, is formed. Here, the dividing slits 202 provided between the unit regions 201 are formed such that parts of the adjacent light reflective members, partitioned by each dividing slit, are coupled to each other in order to hold the plurality of unit regions 201 in the aggregated state. Then, stepped parts are formed in the respective separation grooves S of the lead frame base metal by wet etching. After forming the stepped parts, the amorphous layer made of NiP, the underlayer made of Pd, the underlayer made of Au, and the Ag-containing layer are formed over the surface of the lead frame base metal in this order by plating, thereby forming the lead frame made of the light reflective member 1.

Figure 4B:
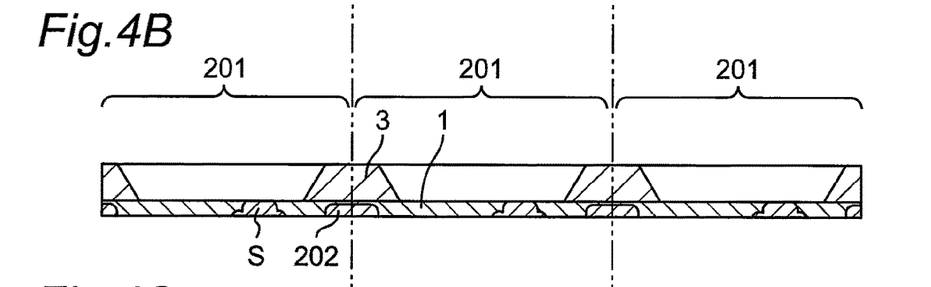
FIG. 4B is another schematic cross-sectional view for explaining another step in the method for manufacturing the light emitting device according to the fourth embodiment.

As shown in FIG. 4B, in the thus-formed lead frame made of the light reflective member 1, the resin molded body 3 is formed by a transfer molding method. The resin molded body 3 is formed such that a pair of leads are exposed at the bottom surface of the concave part in each unit region 201 while being separated from each other within each unit region 201 as shown in FIG. 4B. In this way, the light reflective members 1 are exposed at the bottom surface of the concave part in each unit region.

Figure 4C:
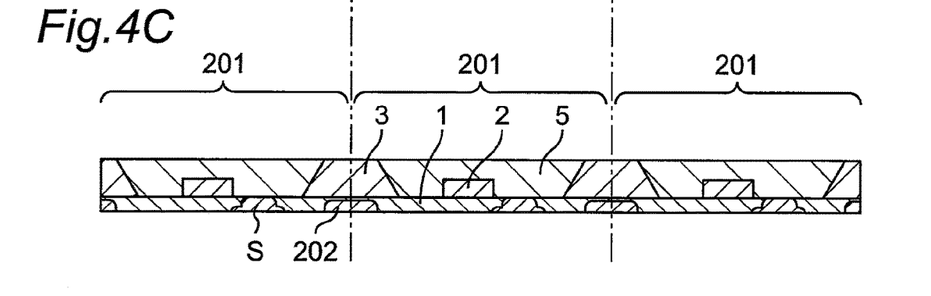
FIG. 4C is another schematic cross-sectional view for explaining another step in the method for manufacturing the light emitting device according to the fourth embodiment.

Then, as shown in FIG. 4C, each light emitting element 2 is mounted in an element mounting region of the concave part within each unit region. Specifically, the light emitting element 2 is mounted and bonded onto one of the pair of lead frames (light reflective members 1), separated and exposed in each concave part, via the bonding member. Subsequently, the light emitting element 2 is connected to the lead frames by the wires. Then, the seal member 5 is provided within the concave parts.

Figure 4D:
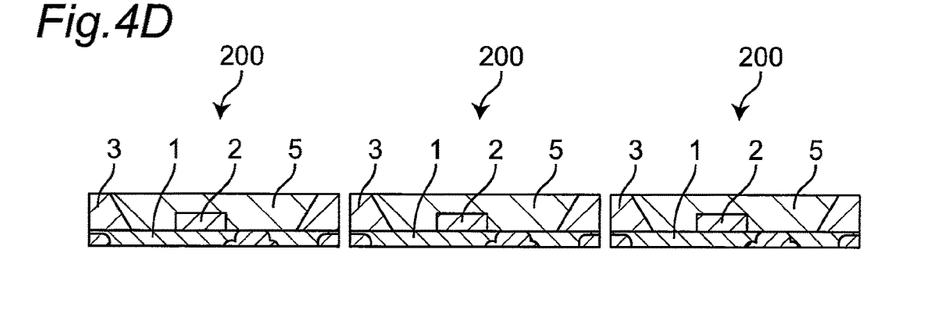
FIG. 4D is another schematic cross-sectional view for explaining another step in the method for manufacturing the light emitting device according to the fourth embodiment.

Thereafter, as shown in FIG. 4D, the lead frames made of the light reflective members 1 and the resin molded bodies 3 are cut by using a dicing saw or the like, thereby singulating the individual light emitting devices shown in FIGS. 3A and 3B. By this cutting, the cross-section of each light reflective member 1 is exposed at the outer side surfaces of the light emitting device 200. At this cross-section, the base metal of Cu, the amorphous layer of NiP, the underlayer of Pd, the underlayer of Au, and the Ag-containing layer are exposed.

In this way, the light emitting device 200 including the flat plate-shaped light reflective members 1 with no bent part can be manufactured.

EXAMPLES

Light emitting devices having substantially the same structure as that of the light emitting device shown in FIGS. 2A and 2B were manufactured in the Examples described below.

Figure 6:
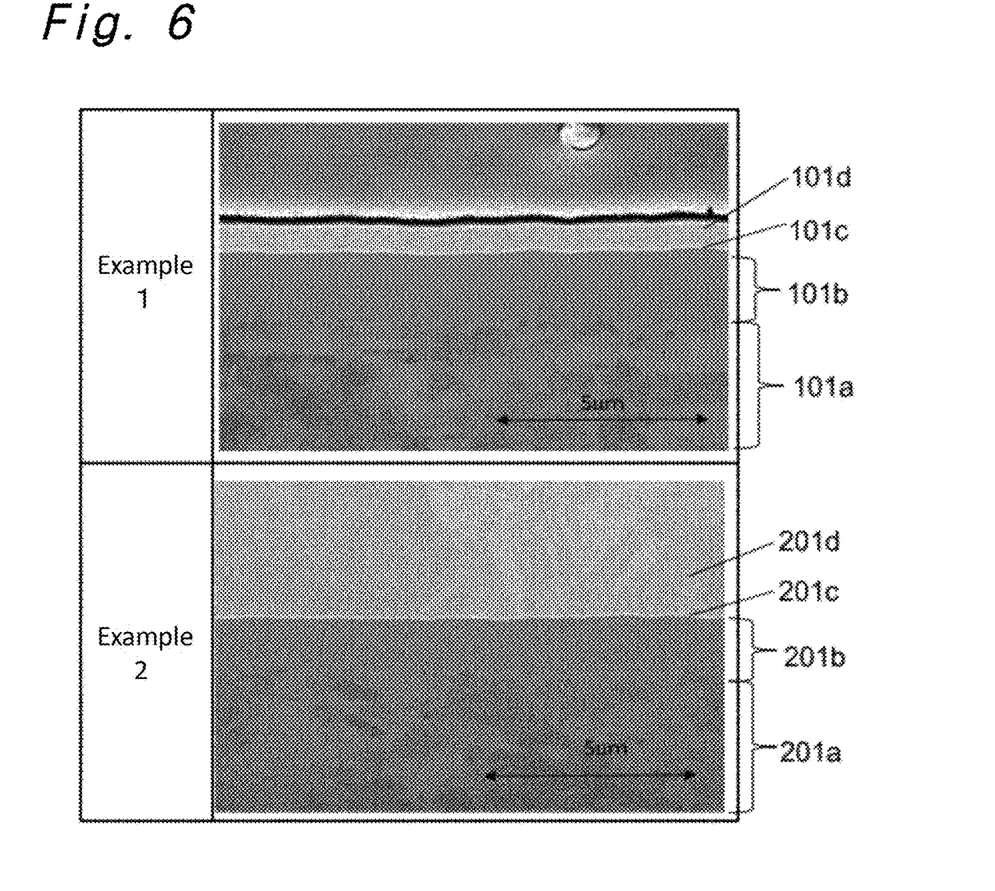
FIG. 6 shows cross-sectional observation images of cross-sections of light reflective members in light emitting devices, taken by a Focus Ion Beam Scanning Electron Microscope (FIB-SEM), in Examples according to the one embodiment of the present invention.

In Example 1, as shown in FIG. 6, a NiP alloy layer of 2 μm in thickness as an amorphous layer 101b, a Pd layer of 0.07 μm in thickness as an underlayer 101c, a Au layer of 0.004 μm in thickness as another underlayer 101c, and an Ag layer of 0.5 μm in thickness as an Ag-containing layer 101d were formed in this order over the surface of a base metal 101a made of Cu by electrolytic plating, thereby preparing light reflective members 101 as a pair of lead frames.

In Example 2, as shown in FIG. 6, a NiP alloy layer of 1 μm in thickness as the amorphous layer 201b, a Pd layer of 0.03 μm in thickness as the underlayer 201c, a Au layer of 0.003 μm in thickness as another underlayer 201c, and an Ag layer of 3.0 μm in thickness as an Ag-containing layer 201d were formed in this order over the surface of a base metal 201a made of Cu by electrolytic plating, thereby preparing the light reflective members 201 as a pair of lead frames.

The amorphous layer 1b made of NiP was fabricated by plating at a liquid temperature of 60° C. and a current density of 5 A/dm$^2$ using the following bath composition at pH 3.0, with reference to an electrolytic plating bath mentioned in JP 05-78882 A:
nickel sulfate=150 g/L;
nickel chloride=40 g/L;
sodium citrate=147 g/L;
phosphorous acid=82 g/L; and
boric acid=30 g/L.

In the Comparative Examples described below, light emitting devices that had basically the same structure as that in the Examples, but including a Ni layer 1z instead of the amorphous layer 1b, were manufactured.

Figure 7:
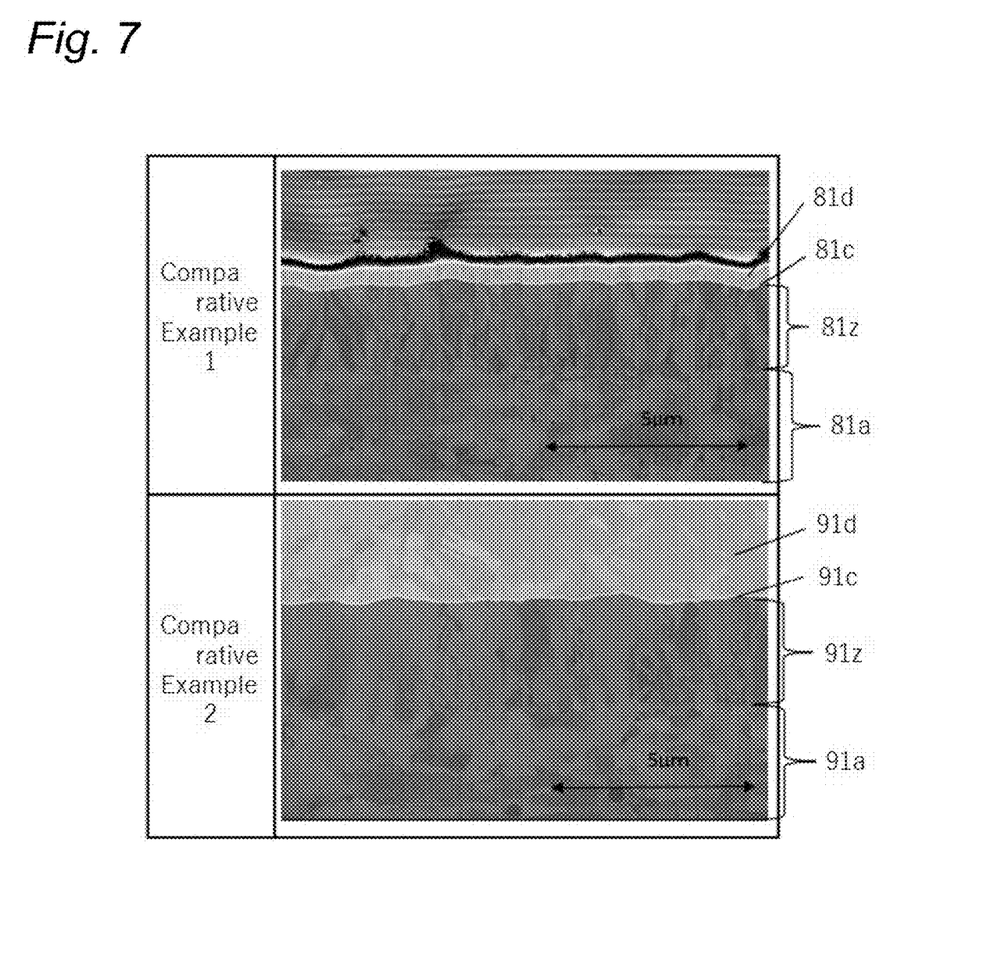
FIG. 7 shows cross-sectional observation images of cross-sections of light reflective members in light emitting devices, taken by the FIB-SEM, in Comparative Examples, as compared with Examples according to the one embodiment of the present invention.

In Comparative Example 1, as shown in FIG. 7, a Ni layer of 2 μm in thickness as the Ni layer 81z, a Pd layer of 0.03 μm in thickness as the underlayer 81c, a Au layer of 0.005 μm in thickness as another underlayer 81c, and an Ag layer of 0.5 μm in thickness as an Ag-containing layer 81d were formed in this order over the surface of the base metal 81a made of Cu by electrolytic plating, thereby preparing the light reflective members as a pair of lead frames.

In Comparative Example 2, as shown in FIG. 7, a Ni layer of 1 μm in thickness as a Ni layer 91z, a Pd layer of 0.03 μm in thickness as the underlayer 91c, a Au layer of 0.005 μm in thickness as another underlayer 91c, and an Ag layer of 3.0 μm in thickness as an Ag-containing layer 91d were formed in this order over the surface of the base metal 91a made of Cu by electrolytic plating, thereby preparing the light reflective members as a pair of lead frames.

The Ni layer was fabricated by plating at a liquid temperature of 55° C. and a current density of 5 A/dm$^2$ using the following bath composition at pH 4.0:
nickel sulfamate=450 g/L;
nickel chloride=10 g/L; and
boric acid=30 g/L.

As shown in FIG. 7, as the result of observation of the cross-sections by using the FIB-SEM, the Ni layer in each Comparative Example was found to be a crystalline coating, and also the crystalline state of the base metal influences a region up to the Ag-containing layer.

However, as shown in FIG. 6, in Examples 1 and 2, phosphorus (p) was uniformly dispersed in the NiP alloy, which clearly shows that the NiP alloy layer was an amorphous layer. Furthermore, the Ag-containing layers 101d and 201d were not influenced by the crystalline states of the base metals 101a and 201a.

Further, the results of observation with an X-ray diffraction device showed that the Ni layer in the Comparative Examples exhibited a sharp diffraction peak, which appeared in the crystalline plating film, while the NiP alloy layer in Examples exhibited a broad diffraction peak, which was a proof of the amorphous state.

Then, as shown in FIGS. 2A and 2B, each resin molded body 3 as the base body with these lead frames 1 embedded therein was formed. Note that until being singulated into the individual light emitting devices 100, the light emitting devices 100 were subjected to respective processes in the aggregated state in which a plurality of pairs of lead frames 1 were coupled into a temporary lead frame 1 with a plurality of resin molded bodies 3 molded therein. For convenience, only one (single) light emitting device 100 will be described with reference to FIGS. 2A and 2B.

The resin molded body 3 in the Examples had the concave part. The light reflective members 1 were exposed at the bottom surface of the concave part. A translucent resin was placed as the bonding member 4 on the light reflective members 1, and the rectangular light emitting element 2 in the planar view with the positive and negative electrodes was mounted and bonded together on the upper surface of the bonding member 4. Thereafter, a seal resin made of a translucent resin containing an YAG phosphor was formed within the concave part.

Figure 5:
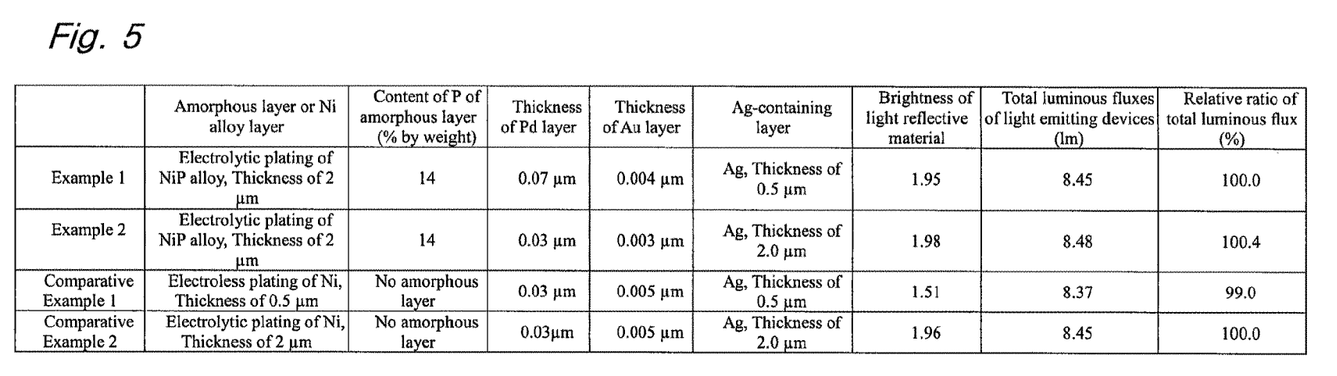
FIG. 5 is a table showing the structures and measurement results of light emitting devices in Examples according to one embodiment of the present invention and in Comparative Examples.

The total luminous fluxes of the light emitting devices manufactured in this way were measured, and the results of the measurements are shown in FIG. 5.

As shown in FIG. 5, the light emitting devices in both Examples 1 and 2 exhibited high total luminous fluxes, regardless of the thickness of the Ag-containing layers 101d and 201d. Meanwhile, regarding the light emitting devices in Comparative Examples, when the Ag-containing layer 91d was thin, like in Comparative Example 1, only a low total luminous flux was obtained. When the Ag-containing layer was thick, like in Comparative Example 2, a high total luminous flux was able to be obtained.

Figure 8:
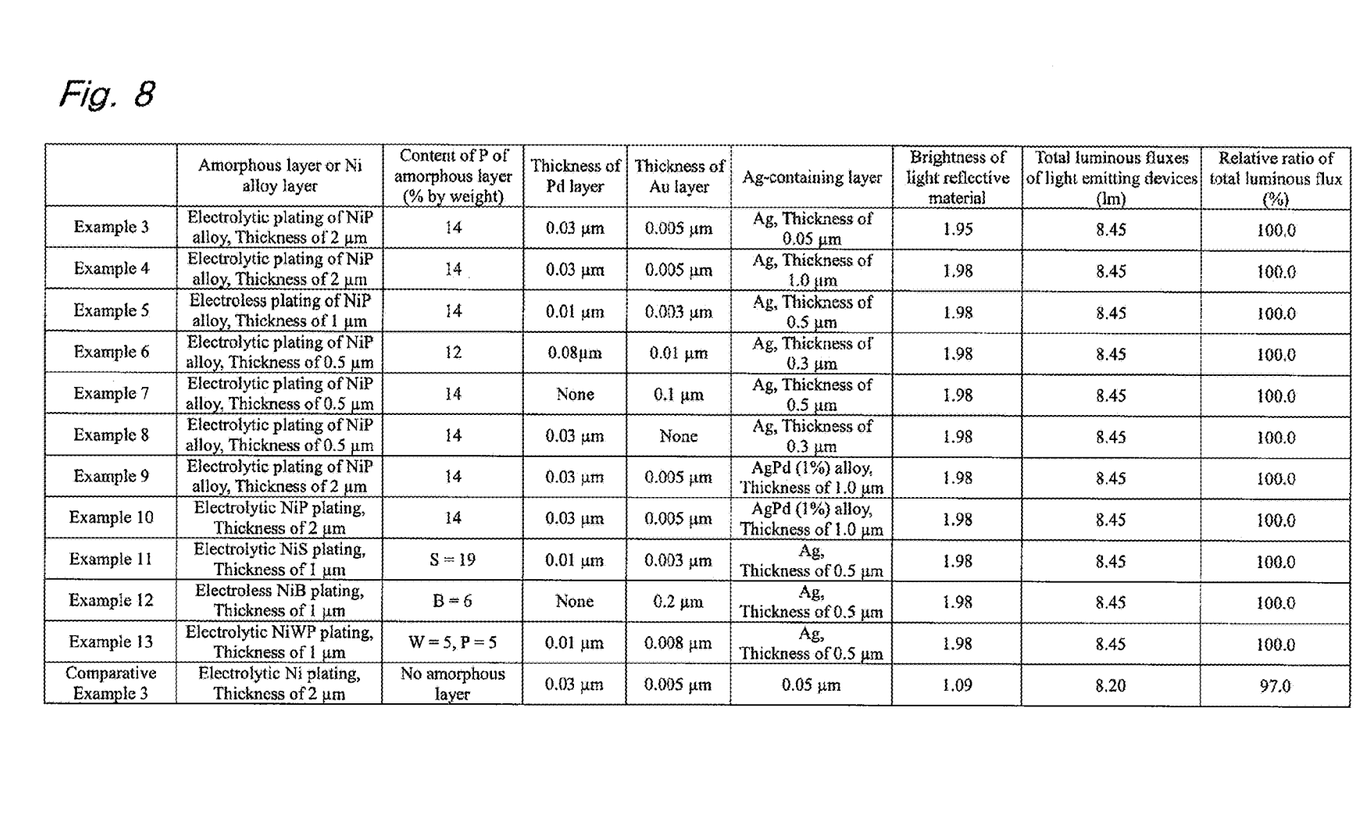
FIG. 8 is a table showing the structures and expected measurement results of light emitting devices in Examples associated with one embodiment of the present invention and in Comparative Example.

FIG. 8 shows combinations of the amorphous layer, underlayer, and Ag-containing layer, usable in the light reflective member 1 according to this embodiment, the anticipated brightness of the light reflective member, the total luminous flux of the light emitting device, and a relative ratio of the total luminous flux in each of Examples and Comparative Example to that in Example 1.

In all the Examples, the reflectance of the Ag-containing layer is improved, so that an improvement in the light extraction efficiency of the light emitting device can be expected.

What is claimed is:

1. A light emitting device comprising:
a light emitting element; and
a light reflective member adapted to reflect light emitted from the light emitting element, the light reflective member comprising a base metal made of a crystallized metal, an amorphous layer located over the base metal and made of an amorphous metal, and an Ag-containing layer located over the amorphous layer.

2. The light emitting device according to claim 1, wherein the amorphous layer is made of a NiP alloy.

3. The light emitting device according to claim 1, wherein a thickness of the Ag-containing layer is not less than 0.05 μm nor more than 1.0 μm.

4. The light emitting device according to claim 1, further comprising an underlayer between the Ag-containing layer and the amorphous layer.

5. The light emitting device according to claim 4, wherein the underlayer comprises a Pd layer and an Au layer from the amorphous layer side.

6. The light emitting device according to claim 1, further comprising a wire connecting the light emitting element and the light reflective member, the wire being made of one of Au, Ag and Ag alloy thereof.

7. The light emitting device according to claim 1, wherein the light emitting element is mounted on the Ag-containing layer.

8. The light emitting device according to claim 1, further comprising a resin molded body in which the light reflective member is embedded such that at least a part of a surface of the Ag-containing layer is exposed.

9. The light emitting device according to claim 1, wherein the light reflective member has a substantially flat-plate shape not having a bent part.

10. A method for manufacturing a light emitting device, the method comprising:
preparing a light reflective member by performing steps comprising:
providing a base metal;
forming an amorphous layer made of an amorphous metal over the base metal by plating; and
forming an Ag-containing layer over the amorphous layer by plating;
preparing a package comprising the light reflective member; and
mounting a light emitting element in the package.

11. The method for manufacturing a light emitting device according to claim 10, wherein the Ag-containing layer is formed to have a thickness not less than 0.05 μm nor more than 1.0 μm.

12. The method for manufacturing a light emitting device according to claim 10, wherein the amorphous layer is formed of a NiP alloy, and the amorphous layer is formed using a NiP plating solution.

13. The method for manufacturing a light emitting device according to claim 10, wherein the amorphous layer is formed by electrolytic plating.

14. The method for manufacturing a light emitting device according to claim 10, wherein the base metal is formed by rolling.

15. A package for a light emitting device, the package comprising:
a light reflective member adapted to reflect light emitted from a light emitting element, the light reflective member comprising:
a base metal made of a crystallized metal,
an amorphous layer located over the base metal and made of an amorphous metal, and
an Ag-containing layer provided over the amorphous layer; and
a base body that supports the light reflective member.

* * * * *